United States Patent [19]

McClure

[11] Patent Number: 5,418,756
[45] Date of Patent: May 23, 1995

[54] EDGE TRANSITION DETECTION DISABLE CIRCUIT TO ALTER MEMORY DEVICE OPERATING CHARACTERISTICS

[75] Inventor: David C. McClure, Carrollton, Tex.

[73] Assignee: SGS-Thomson Microelectronics, Inc., Carrollton, Tex.

[21] Appl. No.: 129,763

[22] Filed: Sep. 30, 1993

[51] Int. Cl.[6] .................................................. G11C 8/00
[52] U.S. Cl. ................................. 365/233.5; 365/194; 365/195
[58] Field of Search ..................... 365/233.5, 194, 195; 307/480, 465, 202.1, 441

[56] References Cited

U.S. PATENT DOCUMENTS

| | | | |
|---|---|---|---|
| 4,833,650 | 5/1989 | Hirayama et al. | 307/202.1 X |
| 4,891,793 | 1/1990 | Anami | 365/233.5 X |
| 4,893,282 | 1/1990 | Wada et al. | 365/233.5 X |
| 5,214,610 | 5/1993 | Houston | 365/233.5 |

Primary Examiner—Joseph A. Popek
Assistant Examiner—Son Dinh
Attorney, Agent, or Firm—Kenneth C. Hill; Lisa K. Jorgenson; Richard K. Robinson

[57] ABSTRACT

An edge transition detector for a static access memory integrated circuit provides programmable operating characteristics. The edge transition detector includes a delay line taking a state signal received on a signal line as an input and generating a delayed state signal. An exclusive-OR gate takes the state signal and the delayed state signal as inputs and generating a transition pulse signal. An edge transition detector enable line connected to the exclusive-OR gate forces the output level of the exclusive-OR gate to match a predetermined logic level in a power efficient manner. An output buffer taking the transition pulse signal as its input and generating an edge detection pulse signal may also be modified to fusing, mask programming, or bonding to eliminate the edge transition detection signal.

19 Claims, 3 Drawing Sheets

EDGE TRANSITION DETECTION DISABLE CIRCUIT TO ALTER MEMORY DEVICE OPERATING CHARACTERISTICS

BACKGROUND OF THE INVENTION

1. Field of the Invention

The invention relates to integrated circuit devices, and more particularly to static random access memory (SRAM) integrated circuits providing user selectable operating speed, noise immunity, or power consumption.

2. Description of the Prior Art

SRAMs hold advantages in speed and power demand over comparable capacity dynamic random access memories (DRAMs). Memory cells in SRAMs are based on latches instead of capacitors as in DRAMs. Capacitors dissipate a charge (corresponding to a bit of data) over time and thus require periodic refresh. Refresh requires power. Reading and writing to a capacitor based memory device requires both time and power. Thus, SRAMs have been advantageously used in applications requiring high speed operation (e.g. cache memory for personal computers), or low power consumption (e.g. portable computers powered by batteries). In addition, SRAM integrated circuits are simpler to use than competing DRAMs because DRAMs require complex circuitry for clocks and refresh operations. Thus SRAMs have been favored where the improved performance justifies their greater expense, or in basic electronic components where the incremental design cost to handle refresh is unjustified.

To further enhance SRAM operating speed, edge transition detection circuits have been integrated with the address decoding circuitry of SRAM devices. Edge transition detection provides a pulse to internally synchronized components of an SRAM in response to leading edge transitions in the state of any of a set of address or control signals. This can be used for controlling precharging and equilibration operations within the SRAM preparatory to reading or writing of data. However, while useful for high speed operation, edge transition detection tends to increase on chip noise and power consumption. In some applications, users may wish to trade speed for less noise and lower power consumption. However, rather than providing two distinct SRAM designs, it would be convenient to be able to reprogram or reconfigure one SRAM type to elect or not elect edge transition detection operation.

SUMMARY OF THE INVENTION

It is an object of the invention to provide a static random access memory (SRAM) circuit allowing user selectable operating speed, power consumption or noise tolerance.

The present invention provides a static random access memory integrated circuit having a plurality of address lines for carrying address signals or control lines for control signals. A delay circuit is connected to each address or control line for generating a delayed signal. A plurality of comparison circuits are provided including one comparison circuit for each address line, each comparison circuit taking an address signal and a corresponding delayed address signal as inputs for generating a transition pulse on an output node whenever the address signal and the corresponding delayed address signal differ in value, which occurs each time there is a change in state of the address signal. An enable input to the comparison circuit allows selective activation of the delay and comparison circuitry. A plurality of internal nodes within the comparison circuit may be connected to a predetermined logic level in response to loss of the enable input. This disables the comparison device.

A NOR-gate is connected to the output lines from the plurality of comparison circuits for generating an edge transition pulse whenever a transition pulse appears on any output line. The NOR-gate has a plurality of transistors, each of which is connected at a control node to an output line and to a common output node. The common output node is connected to a leakage transistor for returning the common output node to predetermined logic level. A fuse in the common node may be blown to suppress generation of an edge transition pulse or a mask option may be utilized. Finally the input node for each of the plurality of transistors of the NOR-gate may be selectively connected to the predetermined logic level for suppressing generation of an edge transition pulse.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
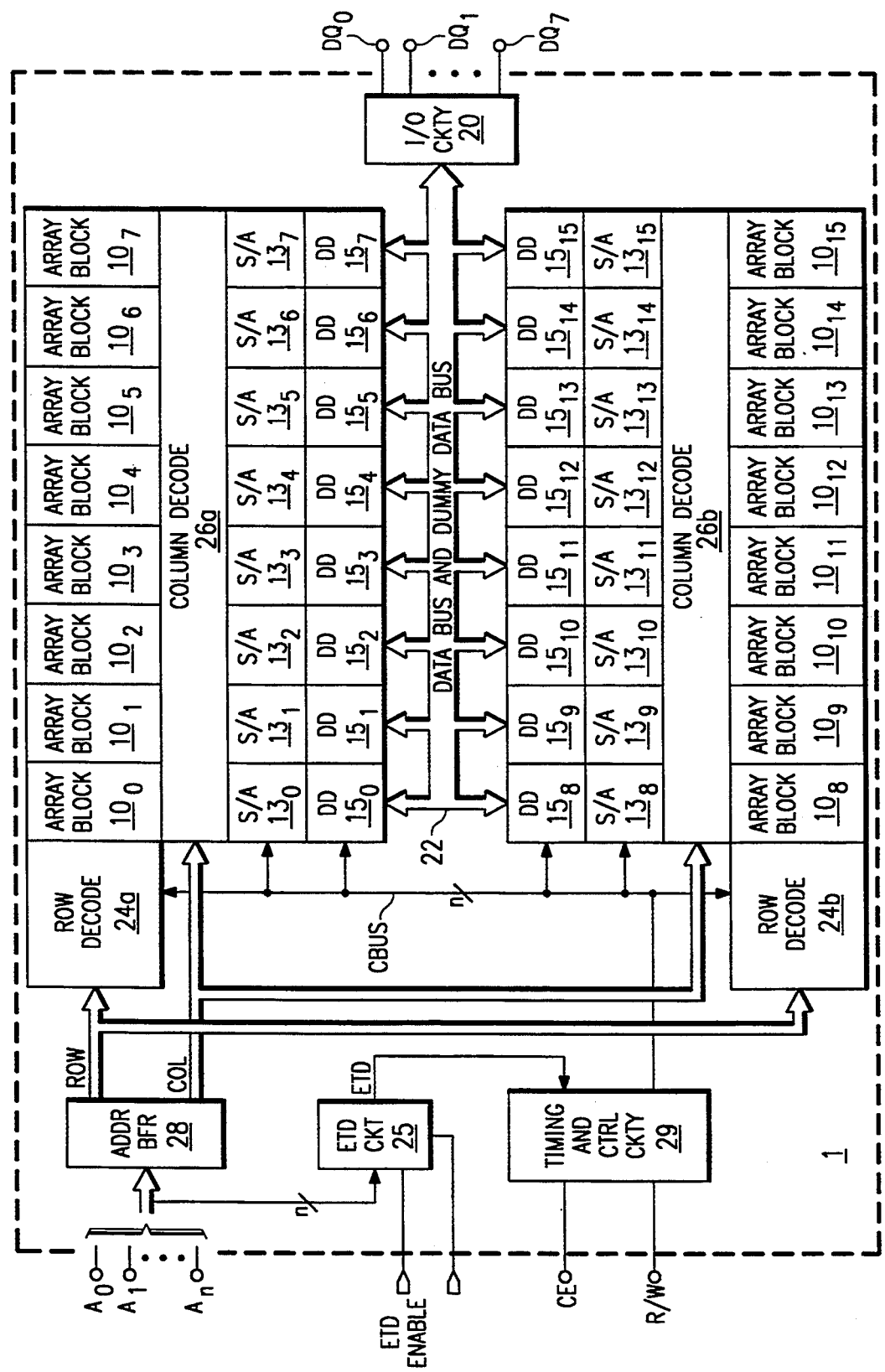
FIG. 1 is a block diagram of a static random access memory.

FIG. 1 illustrates an example of an integrated circuit (IC) memory 1 with which a preferred embodiment of the invention may be implemented. IC memory 1 is a static random access memory (SRAM) of otherwise conventional architecture, having its memory cells in multiple blocks 10.

Memory cells in IC memory 1 are arranged in rows and columns. It should be noted that the designation of rows and columns in memory 1 use the term row to refer to the array direction in which a plurality of memory cells are selected by way of a wordline. In conventional memories, each of the memory cells in the selected row are generally coupled to one or a complementary pair of bit lines. The term column is used in this description to refer to the array direction in which one or more of the memory cells in the selected row are selected for read or write access. In conventional memories, this is generally accomplished by coupling one of the bit lines to a sense amplifier/write circuit, or to an internal data bus. It is contemplated that such use of the terms and columns is consistent with the general understanding in the art.

Address terminals $A_0$ through $A_n$ receive an address signal according to which the memory cells to be accessed are designated. In the conventional manner, address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected wordline in the conventional manner, and in this example are located along a side of the memory array blocks 10. Column decoders 26a, 26b, in this example, select eight memory cells in the selected row to be sensed by a sense amplifier 13 according to the column portion of the address.

In memory 1 the memory cells are grouped into sixteen primary array blocks $10_0$ through $10_{15}$. The number of array blocks 10 may, of course, vary from implementation to implementation. This partitioning of the memory into sixteen primary array blocks 10 is particularly beneficial in low power memories, such as may be used in portable computers, as only the block 10 in which the selected memory cells are located need be enabled during a cycle. In this example, each primary array block 10 includes 64 columns. Selection of the block may be done according to one of the row address bits (indicating upper or lower half) and to four of the column address bits (indicating one of sixteen primary array blocks 10 to be selected).

Alternatively, selection of a row within one of said primary array blocks 10 may be made by way of a global wordline generated by row decoders 24a, 24b, extending across those primary array blocks 10 for which it is operable. Pass gates by which memory cells within each of primary array blocks 10 are connected to their bit lines are, in this alternative arrangement, controlled by local wordlines which extend only within each primary array block 10 for each row portion therein. In this arrangement, pass transistors connected between each global wordline and the local wordlines are enabled according to a block portion of the column address, so that only the local wordline associated with the primary array block 10 selected by the column address is enabled, thus reducing the active power dissipation of each memory cycle. An example of such an arrangement is described in Sakurai, et al., "A Low Power 46 ns 256 kbit CMOS Static RAM with Dynamic Double Word Line" *IEEE J Solid State Circuits*, Vol SC-19, No. 5 (IEEE, October 1984), pp. 578–585.

Memory 1, as in the case of most modern SRAMs and DRAMs, may include some amount of dynamic operation, such as precharging and equilibration of certain nodes (e.g., bit lines) at particular points in the memory cycle. Initiation of the cycle in memory 1 occurs by way of address edge transition detection, performed by edge transition detection (ETD) circuit 25. ETD circuit 25 is connected to each of the address inputs $A_0$ through $A_n$, preferably prior to address buffers 28 (as shown), and generates a pulse on line ETD responsive to detecting a transition at any one or more of address inputs $A_0$ through $A_n$; such a pulse is useful in controlling the internal operation of memory 1 in the conventional manner.

Other internal operational functions are controlled by timing and control circuitry 29, which receives the signal on line ETD from ETD circuit 25, and which also receives certain external control signals such as the chip enable signal at terminal CE, and the read/write select signal at terminal R/W. Timing and control circuitry 29 generates various control signals based on these inputs, for control of the various functions within memory 1 in the conventional manner. As shown in FIG. 1, control bus CBUS is connected to sense amplifiers 13 and data drivers 15; other functions are similarly controlled by timing and control circuitry 29 in the conventional manner, with their connections not shown in FIG. 1 for purposes of clarity.

Memory 1 in this example is of the byte-wide type, and as such it has eight input/output terminals $DQ_0$ through $DQ_7$ at which output data is presented during a read operation, and at which input data is received during a write operation. Input/output circuitry 20 is connected between data bus 22 and terminals DQ, and includes conventional input and output buffers connected thereto.

Each of primary array blocks $10_0$ through $10_{15}$ is associated with a corresponding group of sense amplifiers $13_0$ through $13_{15}$, as shown in FIG. 1. In this example, eight individual sense amplifiers 13 are included within each group of sense amplifiers $13_0$ through $13_{15}$, one sense amplifier 13 for each of the eight bits to be communicated on internal data bus 22 from the selected one of primary array blocks $10_0$ through $10_{15}$. Groups of data drivers $15_0$ through $15_{15}$ are each associated with a corresponding group of sense amplifiers $13_0$ through $13_{15}$ for receiving the data signal therefrom and for driving internal data bus 22 therewith; individual data drivers 15 are associated with individual sense amplifiers 13 in each group, one data driver 15 for driving each line in data bus 22.

The memory array is also divided into halves, with primary array blocks $10_0$ through $10_7$ in one array half and primary array blocks $10_8$ through $10_{15}$ in the other half. Internal data bus 22 runs the length of the array halves, and is located therebetween as shown in FIG. 1. In this example, data bus 22 includes eight data conductors, each associated with an input/output terminal $DQ_0$ through $DQ_7$ and coupled thereto via input/output circuitry 20. Each individual data conductor is connected to a corresponding data driver 15 in each of the sixteen data driver groups $15_0$ through $15_{15}$ of the sixteen primary array blocks $10_0$ through $10_{15}$. For a read/write memory such as memory 1, a separate input data bus can be used to communicate input data to be written to the selected memory cells, in the conventional manner. Alternatively, the input data may also be communicated along data bus 22, as is conventional for some memory designs.

In this example, data bus 22 also includes eight dummy data conductors, each of which are also connected to a corresponding data driver 15 in each of the sixteen data driver groups $15_0$ through $15_{15}$ of the sixteen primary array blocks $10_0$ through $10_{15}$, for purposes of precharging data bus 22 by way of charge sharing. Each of these dummy data conductors preferably physically resembles one of the true data conductors, preferably having substantially the same length and cross-sectional area and being formed of the same material, and is maintained, at all times, at a complementary state relative to its true data conductor.

Figure 2:
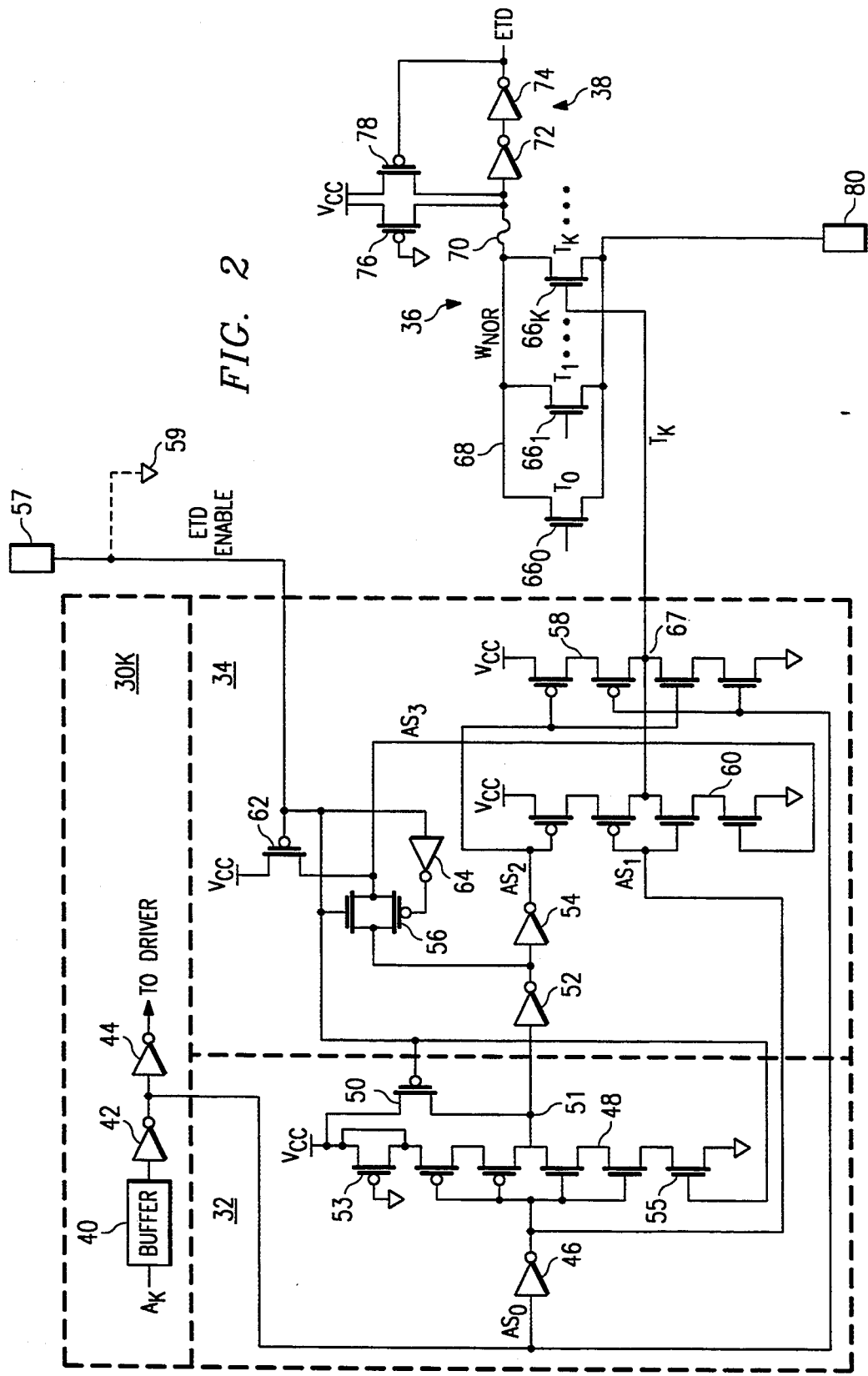
FIG. 2 is a partial circuit schematic of an address edge transition detector for an SRAM.

FIG. 2 is a circuit schematic of an edge transition detection element $30_k$ and a NOR-gate 36 for combining the outputs $T_i$ from $N+1$ edge transition detection elements 30. Element $30_k$ is employed with a representative address line k and is identical for each address line $A_0$–$A_n$. Edge transition detection may also be utilized with control lines. Address signal $A_k$ is received on an address line by buffer 40. The output of buffer 40 is applied to an inverter 42 which is in series with an inverter 44. The output of inverter 44 is available for application to row and column drivers or other circuitry of static random access memory integrated circuit 1. Those applications have no implication for the invention herein.

The output of inverter 42 is designated as an address state signal $AS_0$. Address state signal $AS_0$ is applied to a delay line 32 which includes an inverter 46 (the output of which is $AS_1$) and a modified inverter 48 which function as delay elements. Modified inverter 48 includes an output node forcing transistor 50 connected between $V_{cc}$ and output node 50. Transistor 50 is a P-channel MOSFET which is turned on in response to the signal on its control node going low for forcing output node 51 to $V_{cc}$. Inverter 48 also includes transistor 53, which is biased into conduction, and transistor 55, which is connected to receive the same control signal as forcing transistor 50. Transistor 55 is an N-channel device, and will be on when forcing transistor 50 is in cut-off and vice-versa. Thus when output node 51 is forced to assume the value of $V_{cc}$ by turning transistor 50 on, no conduction path is provided between output node 51 and ground because transistor 55 is assured of being in cut-off. This occurs notwithstanding changes in the value of $AS_1$.

The signal value on output node 51 is applied to two in series inverters 52 and 54, which operate as delay elements. The output of inverter 54 ($AS_2$), is in turn passed to one transistor switch each in transition high detector 58 and in transition low detector 60. The output of inverter 52 is applied to a pass gate 56 which functions as a noninverting delay element in parallel with inverter 54. The output of pass gate 56 is termed $AS_3$ and is also applied to one transistor each in transition high detector 58 and transition low detector 60. Signals $AS_0$ and $AS_1$ are applied, respectively, to two transistors each in transition high detector 58 and transition low detector 60. An output signal $T_k$ from detectors 58 and 60 appears on node 67 and goes high for a period of time determined by selection of the delay values in inverters 46, 48, 52 and 54 in response to a change in state of address signal $A_k$.

The foregoing discussion assumes that an ETD enable signal on pin 57 is high. With ETD enable high, transistor 50 is in cut-off and transistor 55 is on allowing node 51 to follow (after a delay) the value of $AS_0$. Both elements of pass gate 56 are conducting and transistor 62 is off allowing $AS_3$ to follow $AS_0$ (again after delay).

ETD enable may be forced low by control of the control pin signal on pin 57, or by mask or fuse options to tie the pin to ground 59. Alternatively a fuse may be placed in the ETD enable line to be opened by laser repair. When ETD enable goes low, transistors 50 and 62 begin conducting and transistor 55 is driven into cut-off. The output of inverter 64 goes high resulting in both the N-channel and P-channel transistors in pass gate 56 being driven into cut-off. Under these conditions signal value $A_2$ is forced high and signal value $A_3$ is forced high. With $A_2$ and $A_3$ forced high the output of detection arrays 58 and 60 is forced low because their common output node 67 cannot be connected to $V_{cc}$ and is guaranteed connection to ground, either through the two N-channel MOSFETs of array 60, or through the two N-channel MOSFETs of array 58 (either $AS_0$ or $AS_1$ being high most of the time).

The output of exclusive-OR gate 34 appearing on node 67 is termed $T_k$ and is passed to one of a plurality of transition pulse sense elements including elements $66_0$, $66_j$ and $66_k$. Transition pulse sense elements 66 function as a NOR-gate responsive to any high going pulse on a transition sense line T going high. Any such transition turns on a pulse sense element (which are N-channel MOSFETs) thereby pulling common output node 68 low if pin 80, a common input node for the NOR-gate array, is connected to a source of a low logic level. In normal operation, absent one of transistors 66 turning on, bus 68 is held high by a leakage transistor 76 connected between the input to inverter 72 and $V_{cc}$. The capacity of transistor 76 is chosen to be substantially less in transmission capacity of any of sense element 66, allowing any element 66 to pull bus 68 low. Bus 68 is connected by a fuse 70 to the input of an inverter 72 which in turn drives inverter 74. Inverters 72 and 74 function as an output buffer 38 generating a negative going edge transition detection (ETD) signal. The ETD signal fed back to a pull-up transistor 78 which, when driven into conduction, pulls bus 68 high more quickly than transistor 76 can. An edge transition detection pulse is a negative going pulse with a normal logic high value.

One way to disable edge transition detector 28 is to tie pin 80 to $V_{cc}$, which may be done by bond or mask options to provide the needed conductive lead. When pin 80 is tied to $V_{cc}$ bus 68 cannot be pulled low. Alternatively, fuse 70 can be opened by laser repair techniques. If this option is selected leakage transistor 76 operates to hold ETD high.

Figure 3:
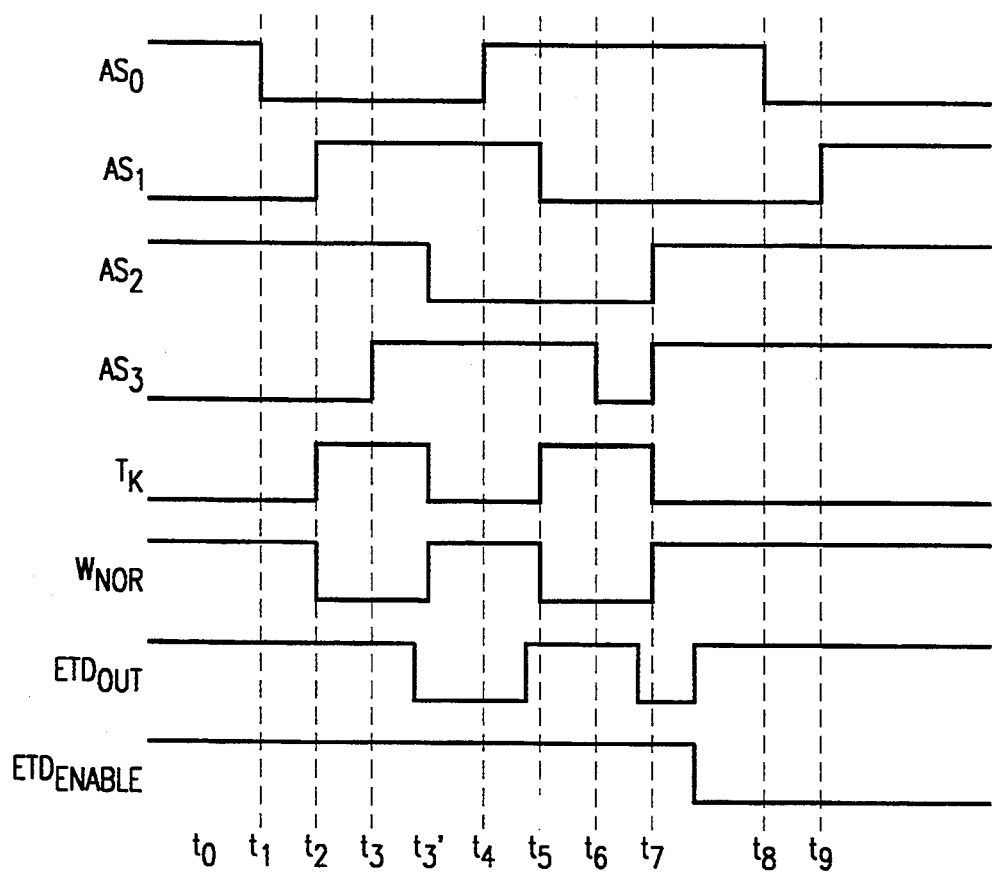
FIG. 3 is a timing diagram.

FIG. 3 is a set of timing diagrams for signals $AS_0$–$AS_3$, $T_k$, $W_{nor}$ (which corresponds to the signal level on bus 68), the edge transition detection signal and the edge transition detection enable signal. At time $T_0$, edge transition detection enable is logic high and assumed to have been logic high for an indefinite prior period of time. $AS_1$ and $AS_3$ are logic low and signal level $AS_2$ is logic high. The transition pulse sense signal $T_k$ is low and both $W_{nor}$ and ETD are logic high indicating no recent transition in state for an address line. Edge transition detection is enabled. At time $T_1$, $AS_0$ goes logic low with a consequent change at $T_2$ in $T_k$, which goes logic high and $W_{nor}$ which goes logic low. Also at time $T_2$, signal $AS_1$ goes from low to high. At time $T_3$, $AS_3$ reverses state resulting in $AS_2$ and the transition sense signal $T_k$ going low at $T'_3$. Also at some point after $T_3$ ETD goes logic low pulling $W_{nor}$ high. At some time after $T_3$, but prior to $T_5$, ETD returns to logic high. At $T_4$; $AS_0$ goes high indicating another transition in address state. The values of $T_k$ and $W_{nor}$ change at $T_5$ as a consequence. At time $T_5$, $AS_1$ goes low and at time $T_6$ $AS_3$ reverses state. $T_k$ and $W_{nor}$ then return to their default levels. An edge transition detection pulse generated just prior to $T_7$ and terminates at some point after $T_7$. ETD enable goes low after $T_7$. As a function of ETD enable going low, signals $A_2$ and $A_3$ are held at logic high. Subsequent changes in the value of $AS_0$ and $AS_1$ at $T_8$ and $T_9$ have no effect on signals $AS_2$, $AS_3$, $T_k$, $W_{nor}$ or ETD.

The invention allows provision of an SRAM which may be programmed to provide characteristics to meet various user requirements for speed, noise immunity, power consumption and data speed parameters by selective use of edge transition detection. In the past this has been done by multiplying gate delays. The invention provides an economical way to meet these ends using conventional bond options, fuse options, or metalization options.

One design supports multiple applications. Applications requiring tight noise tolerance, reduced speed or reduced power consumption can be met by the device with ETD disabled. As shown this can be done by a bond option, fuse option, mask option or control signal option.

Not all methods described here need to be present on an integrated circuit. If all are present only one may be used to cut off edge transition detection. Each of the programmable elements locks the value of ETD, or the output of a particular address or control line element without the power leakage entailed by directly forcing ETD to a predetermined, fixed level.

While the invention has been particularly shown and described with reference to a preferred embodiment, it will be understood by those skilled in the art that various changes in form and detail may be made therein without departing from the spirit and scope of the invention.

What is claimed is:

1. An edge transition detection device, comprising:
   a plurality of delay lines responsive to a plurality of state signals received on a plurality of signal lines as inputs, the delay lines generating a delayed state signals;
   a plurality of exclusive-OR gates responsive to the state signals and the delayed state signals as inputs, the exclusive-OR gates generating a plurality of transition pulse signals;
   an output buffer responsive to the transition pulse signals for generating an edge detection pulse signal, the output buffer including a NOR-gate having as inputs the plurality of transition pulse signals from the plurality of exclusive-OR gates;
   a programmable element for fixing the edge detection pulse signal at a level indicating nonoccurrence of an edge;
   wherein the NOR-gate is a wired NOR-gate which comprises a plurality of transistors each receiving a transition pulse signal on a control node thereof and having a common output node, the common output node being connected to a leakage transistor for returning the common output node to a predetermined logic level; and
   means for selectively connecting an input node for each of the plurality of transistors of the wired NOR-gate to the predetermined logic level for suppressing generation of an edge transition pulse.

2. An edge transition detection device as set forth in claim 1, where the programmable element is a metallic bond, a fuse or a connection made by a mask option.

3. An edge transition detection device as set forth in claim 1, wherein the programmable element comprises:
   a fuse in the common output node of the NOR-gate which may be opened to disable the edge transition detector.

4. An edge transition detection device as set forth in claim 1, wherein the means for selectively connecting includes a pad for external application of a selected voltage level signal.

5. An edge transition detection device, comprising:
   means responsive to change in a state signal received on a signal line for generating a transition pulse signal;
   an output buffer taking the transition pulse signal as its input for generating an edge detection pulse signal, the output buffer including a logic summing circuit taking as inputs a plurality of transition pulse signals from a plurality of means for generating the transition pulse signals, the logic summing circuit including a plurality of transistors each receiving a transition pulse signal on a control node thereof and having a common output node;
   the common output node being connected to a leakage transistor for returning the common output node to predetermined logic level; and
   a programmable element for fixing the edge detection pulse signal at a level indicating nonoccurrence of an edge, the programmable element including means for selectively connecting an input node for each transistor to a predetermined logic level for suppressing generation of an edge transition pulse.

6. An edge transition detection device as set forth in claim 5, wherein the means for selectively connecting includes a pad for external application of a selected voltage level signal.

7. A static random access memory integrated circuit, comprising:
   a plurality of address lines for carrying address signals;
   a delay circuit connected to each address line for generating delayed address signals;
   a plurality of comparison circuits including one comparison circuit for each address line, each comparison circuit taking an address signal and a corresponding delayed address signal as inputs and generating a transition pulse on an output line whenever the address signal and the corresponding delayed address signal differ in value;
   an enable input to each comparison circuit;
   summing logic connected to the output lines from the plurality of comparison circuits for generating an edge transition pulse whenever a transition pulse appears on any output line, and including a common output node including a fuse which may be opened to prevent generation of edge transition pulses;
   means for preventing generation of the edge transition pulse notwithstanding occurrence of the transition pulse.

8. A static random access memory integrated circuit as set forth in claim 7, wherein each comparison circuit further comprises:
   a plurality of internal nodes; and
   means responsive to the enable signal assuming a first logic level for forcing selected internal nodes to a fixed logic level for disabling the comparison device.

9. A static random access memory integrated circuit as set forth in claim 8, wherein the means for biasing comprise:
   transistor switches having control nodes connected to be responsive to the enable signal assuming a first logic level for biasing internal nodes of the comparison circuit.

10. A static random access memory integrated circuit, comprising:
    a plurality of address lines for carrying address signals;
    a delay circuit connected to each address line for generating delayed address signals;
    a plurality of comparison circuits including one comparison circuit for each address line, each comparison circuit taking an address signal and a corresponding delayed address signal as inputs and generating a transition pulse on an output line whenever the address signal and the corresponding delayed address signal differ in value;
    an enable input to each comparison circuit;

summing logic connected to the output lines from the plurality of comparison circuits for generating an edge transition pulse whenever a transition pulse appears on any output line, the summing logic including:
a plurality of transistors each receiving a transition pulse signal on a control node thereof and having a common output node;
the common output node being connected to a leakage transistor for returning the common output node to predetermined logic level; and
means for selectively connecting an input node for each transistor to the predetermined logic level for suppressing generation of an edge transition pulse; and
means for preventing generation of the edge generating pulse notwithstanding occurrence of the transition pulse.

11. A static random access memory integrated circuit as set forth in claim 10, wherein each comparison circuit further comprises:
a plurality of internal nodes; and
means responsive to the enable signal assuming a first logic level for forcing selected internal nodes to a fixed logic level for disabling the comparison device.

12. A static random access memory integrated circuit, comprising:
a plurality of address lines for carrying address signals;
a delay circuit connected to each address line for generating delayed address signals;
a plurality of comparison circuits including one comparison circuit for each address line, each comparison circuit taking an address signal and a corresponding delayed address signal as inputs and generating a transition pulse on an output line whenever the address signal and the corresponding delayed address signal differ in value, each comparison circuit further including a plurality of internal nodes and means responsive to the enable input assuming a first logic level for forcing selected internal nodes to a fixed logic level for disabling the comparison device;
an enable input to each comparison circuit;
summing logic connected to the output lines from the plurality of comparison circuits for generating an edge transition pulse whenever a transition pulse appears on any output line, the summing logic including a common output node including a fuse which may be opened to prevent generation of edge transition pulses; and
means for preventing generation of the edge transition pulse notwithstanding occurrence of the transition pulse.

13. A static random access memory integrated circuit, comprising:
a plurality of address lines for carrying address signals;
a delay circuit connected to each address line for generating delayed address signals;
a plurality of comparison circuits including one comparison circuit for each address line, each comparison circuit taking an address signal and a corresponding delayed address signal as inputs and generating a transition pulse on an output line whenever the address signal and the corresponding delayed address signal differ in value, each comparison circuit further including a plurality of internal nodes and means responsive to the enable input assuming a first logic level for forcing selected internal nodes to a fixed logic level for disabling the comparison device;
an enable input to each comparison circuit;
summing logic connected to the output lines from the plurality of comparison circuits for generating an edge transition pulse whenever a transition pulse appears on any output line, the summing logic including:
a plurality of transistors each receiving a transition pulse signal on a control node thereof and having a common output node;
the common output node being connected to a leakage transistor for returning the common output node to predetermined logic level; and
means for selectively connecting an input node for each transistor to the predetermined logic level for suppressing generation of an edge transition pulse; and
means for preventing generation of the edge transition pulse notwithstanding occurrence of the transition pulse.

14. A static random access memory integrated circuit, comprising:
a plurality of address lines for carrying address signals;
a delay circuit connected to each address line for generating delayed address signals;
a plurality of comparison circuits including one comparison circuit for each address line, each comparison circuit taking an address signal and a corresponding delayed address signal as inputs and generating a transition pulse on an output line whenever the address signal and the corresponding delayed address signal differ in value;
an enable input to each comparison circuit;
summing logic connected to the output lines from the plurality of comparison circuits for generating an edge transition pulse whenever a transition pulse appears on any output line;
the summing logic having a plurality of transistors each receiving a transition pulse signal on a control node thereof and having a common output node, the common output node being connected to a leakage transistor for returning the common output node to predetermined logic level.
a plurality of internal nodes; and
means for biasing selected internal nodes to a fixed logic level and disabling edge transition detection.

15. A static random access memory integrated circuit as set forth in claim 14, wherein the means for biasing comprise:
a fuse in the common output node which may be blown to suppress generation of an edge transition pulse.

16. A static random access memory integrated circuit as set forth in claim 14, wherein the means for biasing comprise:
means for selectively connecting an input node for each of the plurality of transistors of the NOR-gate to the predetermined logic level for suppressing generation of an edge transition pulse.

17. A static random access memory integrated circuit as set forth in claim 16, wherein the means for selectively connecting further comprises:

an external pin which may be connected to a selected logic level source.

18. A static random access memory integrated circuit as set forth in claim 16, wherein the means for selectively connecting further comprises; mask programmable locations for connection of the input nodes to a desired logic level.

19. A static random access memory integrated circuit as set forth in claim 16, wherein the comparison circuit includes delay gates and wherein an enable signal is bussed to delay gates to force a state.

* * * * *